(12) United States Patent
Sakai

(10) Patent No.: US 9,640,619 B2
(45) Date of Patent: May 2, 2017

(54) METHODS OF MANUFACTURING WIDE BAND GAP SEMICONDUCTOR DEVICE AND SEMICONDUCTOR MODULE, AND WIDE BAND GAP SEMICONDUCTOR DEVICE AND SEMICONDUCTOR MODULE

(71) Applicant: Sumitomo Electric Industries, Ltd., Osaka-shi (JP)

(72) Inventor: Mitsuhiko Sakai, Osaka (JP)

(73) Assignee: Sumitomo Electric Industries, Ltd., Osaka-shi (JP)

(*) Notice: Subject to any disclaimer, the term of this patent is extended or adjusted under 35 U.S.C. 154(b) by 0 days.

(21) Appl. No.: 14/913,747

(22) PCT Filed: Jul. 17, 2014

(86) PCT No.: PCT/JP2014/069010
§ 371 (c)(1),
(2) Date: Feb. 23, 2016

(87) PCT Pub. No.: WO2015/029635
PCT Pub. Date: Mar. 5, 2015

(65) Prior Publication Data
US 2016/0204086 A1    Jul. 14, 2016

(30) Foreign Application Priority Data
Aug. 28, 2013    (JP) ................. 2013-176884

(51) Int. Cl.
*H01L 29/16*    (2006.01)
*H01L 21/78*    (2006.01)
(Continued)

(52) U.S. Cl.
CPC .......... *H01L 29/1608* (2013.01); *H01L 21/78* (2013.01); *H01L 22/14* (2013.01);
(Continued)

(58) Field of Classification Search
None
See application file for complete search history.

(56) References Cited

U.S. PATENT DOCUMENTS 5,617,036 A * 4/1997 Roff .................. G01R 31/2884
324/750.05
5,877,518 A    3/1999 Sakurai et al.
(Continued)

FOREIGN PATENT DOCUMENTS

JP    49-105480       10/1974
JP    59-003943 A    1/1984
(Continued)

OTHER PUBLICATIONS

International Search Report in International Application No. PCT/JP2014/069010, dated Oct. 14, 2014.
Notice of Grounds of Rejection in counterpart Japanese Patent Application No. 2013-176884, dated Mar. 14, 2017.

*Primary Examiner* — Matthew Reames
*Assistant Examiner* — Steven B Gauthier
(74) *Attorney, Agent, or Firm* — Venable LLP; Michael A. Sartori; F. Brock Riggs

(57) ABSTRACT

A method of manufacturing a wide band gap semiconductor device includes the steps of preparing a wide band gap semiconductor substrate, separating the wide band gap semiconductor substrate into a plurality of first semiconductor chips, fixing the plurality of first semiconductor chips on a fixation member, measuring a breakdown voltage of each of the first semiconductor chips while immersing at least the first semiconductor chips in inert liquid, and after the step of measuring a breakdown voltage of each of the first semiconductor chips, providing a plurality of second semiconductor chips each having each of the first semiconductor chips fixed on the fixation member, by cutting the fixation member.

8 Claims, 13 Drawing Sheets

(51) Int. Cl.
*H01L 21/66* (2006.01)
*H01L 23/00* (2006.01)
*H01L 25/00* (2006.01)
*G01R 31/12* (2006.01)
*H01L 25/07* (2006.01)
*H01L 29/78* (2006.01)
*H01L 29/20* (2006.01)

(52) U.S. Cl.
CPC .............. *H01L 24/32* (2013.01); *H01L 24/83* (2013.01); *H01L 24/97* (2013.01); *H01L 25/50* (2013.01); *G01R 31/129* (2013.01); *H01L 25/072* (2013.01); *H01L 29/1602* (2013.01); *H01L 29/2003* (2013.01); *H01L 29/7802* (2013.01); *H01L 2224/29111* (2013.01); *H01L 2224/29139* (2013.01); *H01L 2224/29144* (2013.01); *H01L 2224/32225* (2013.01); *H01L 2224/32245* (2013.01); *H01L 2224/48091* (2013.01); *H01L 2224/48137* (2013.01); *H01L 2924/01013* (2013.01); *H01L 2924/01029* (2013.01); *H01L 2924/0132* (2013.01); *H01L 2924/01047* (2013.01); *H01L 2924/01074* (2013.01); *H01L 2924/1033* (2013.01); *H01L 2924/10272* (2013.01); *H01L 2924/13091* (2013.01); *H01L 2924/15724* (2013.01); *H01L 2924/15738* (2013.01); *H01L 2924/15747* (2013.01)

(56) References Cited

U.S. PATENT DOCUMENTS

| | | | |
|---|---|---|---|
| 6,414,388 | B1 | 7/2002 | Moriyama |
| 2006/0051937 | A1* | 3/2006 | Ploessl .............. H01L 21/6835 438/459 |
| 2007/0274047 | A1 | 11/2007 | Nagase et al. |
| 2009/0145642 | A1 | 6/2009 | Kuromitsu et al. |
| 2009/0207580 | A1 | 8/2009 | Oshika et al. |
| 2011/0244604 | A1* | 10/2011 | Narazaki ................ H01L 22/14 438/17 |

FOREIGN PATENT DOCUMENTS

| | | |
|---|---|---|
| JP | 5-67697 A | 3/1993 |
| JP | H06-120315 A | 4/1994 |
| JP | H08-037294 A | 2/1996 |
| JP | 2001-034983 A | 2/2001 |
| JP | 2002-237495 A | 8/2002 |
| JP | 2003-100819 A | 4/2003 |
| JP | 2006-261569 A | 9/2006 |
| JP | 2008-004599 A | 1/2008 |
| JP | 2008-103558 A | 5/2008 |
| JP | 2008-117841 A | 5/2008 |
| JP | 2011-216764 A | 10/2011 |
| NO | 2005/098942 A1 | 10/2005 |
| WO | WO-2010/021070 A1 | 2/2010 |

\* cited by examiner

METHODS OF MANUFACTURING WIDE BAND GAP SEMICONDUCTOR DEVICE AND SEMICONDUCTOR MODULE, AND WIDE BAND GAP SEMICONDUCTOR DEVICE AND SEMICONDUCTOR MODULE

TECHNICAL FIELD

The present invention relates to methods of manufacturing a wide band gap semiconductor device and a semiconductor module, and a wide band gap semiconductor device and a semiconductor module.

BACKGROUND ART

Breakdown voltage is one of the important characteristics of a semiconductor device such as a MOSFET (Metal Oxide Semiconductor Field Effect Transistor). Thus, in methods of manufacturing a semiconductor device and a semiconductor module, a breakdown voltage measurement may be made on individual semiconductor elements after the plurality of semiconductor elements are formed on a semiconductor substrate.

For example, Japanese Patent Laying-Open No. 59-3943 (hereinafter referred to as PTD 1) discloses a method in which an insulating film is formed on a surface of a semiconductor substrate having a semiconductor element formed thereon, and a prober is brought into contact with an electrode by penetrating the insulating film, to carry out a probe test. Japanese Patent Laying-Open No. 2003-100819 (hereinafter referred to as PTD 2) discloses a method of making a breakdown voltage measurement while a semiconductor substrate having a semiconductor element formed thereon is immersed in insulating liquid. WO 2010/021070 (hereinafter referred to as PTD 3) discloses a method in which a surface of a semiconductor substrate is potted with insulating liquid and then a probe is brought into contact with an electrode, to thereby measure the breakdown voltage of a semiconductor element.

CITATION LIST

Patent Documents

PTD 1: Japanese Patent Laying-Open No. 59-3943
PTD 2: Japanese Patent Laying-Open No. 2003-100819
PTD 3: WO 2010/021070

SUMMARY OF INVENTION

Technical Problem

Conventionally, as in PTDs 1 to 3 described above, a breakdown voltage measurement is made on individual semiconductor elements in the state of a semiconductor substrate, and then the semiconductor substrate is separated into the individual semiconductor elements through a dicing process. Then, the separated semiconductor elements are mounted on a module substrate to manufacture a semiconductor module. That is, since it has been conventionally difficult to make a breakdown voltage measurement on the separated individual semiconductor elements, a breakdown voltage measurement has been made in the state of a semiconductor substrate before the separation. In this case, even if no defect was detected during the breakdown voltage measurement before the separation (the state of a semiconductor substrate), a defect may be found during an inspection of the module having the individual semiconductor elements mounted hereon. Mounting of a defective chip on the module in this manner results in a reduced manufacturing yield of semiconductor modules.

The present invention has been made in view of the problem described above, and one object of the present invention is to provide a method of manufacturing a wide band gap semiconductor device capable of improving a manufacturing yield of semiconductor modules, and a method of manufacturing a semiconductor module using this method of manufacturing a wide band gap semiconductor device. Another object of the present invention is to provide a wide band gap semiconductor device capable of improving a manufacturing yield of semiconductor modules, and a semiconductor module including this wide band gap semiconductor device.

Solution to Problem

A method of manufacturing a wide band gap semiconductor device according to the present invention includes the steps of preparing a wide band gap semiconductor substrate having a pair of opposite main surfaces, with an electrode formed on each of the pair of main surfaces, separating the wide band gap semiconductor substrate into a plurality of first semiconductor chips, fixing the plurality of first semiconductor chips on a conductive fixation member, after the step of fixing the first semiconductor chips, measuring a breakdown voltage of each of the first semiconductor chips while immersing at least the first semiconductor chips in inert liquid, and after the step of measuring a breakdown voltage of each of the first semiconductor chips, providing a plurality of second semiconductor chips each having each of the first semiconductor chips fixed on the fixation member, by cutting the fixation member.

A wide band gap semiconductor device according to the present invention includes a first semiconductor chip having a pair of opposite main surfaces, with an electrode formed on each of the pair of main surfaces, a conductive fixation member, and a first joining member disposed on one surface of the fixation member to fix the first semiconductor chip on the fixation member. The fixation member has a width greater than that of the first semiconductor chip.

Advantageous Effects of Invention

According to the present invention, a method of manufacturing a wide band gap semiconductor device capable of improving a manufacturing yield of semiconductor modules, and a method of manufacturing a semiconductor module using this method of manufacturing a wide band gap semiconductor device can be provided. Further, according to the present invention, a wide band gap semiconductor device capable of improving a manufacturing yield of semiconductor modules, and a semiconductor module including this wide band gap semiconductor device can be provided.

DESCRIPTION OF EMBODIMENTS

Figure 1:
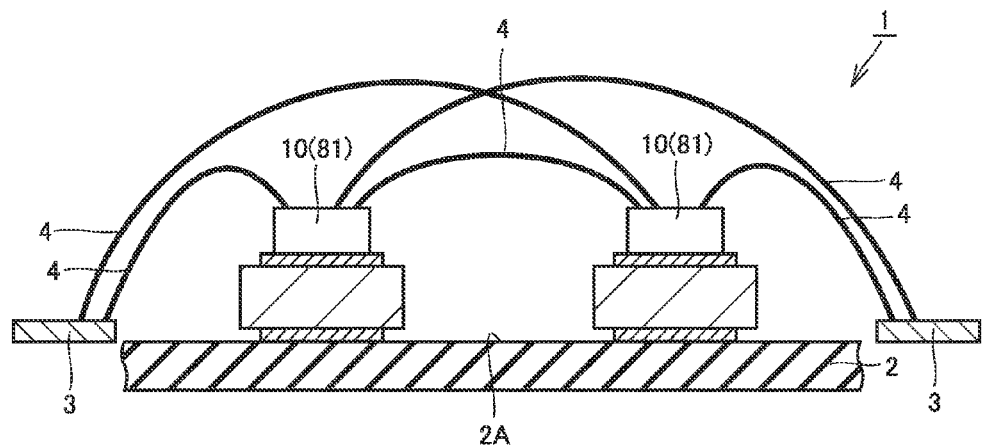
FIG. 1 is a schematic sectional view showing a structure of a semiconductor module according to a first embodiment.

Description of Embodiments of the Present Invention

The contents of embodiments of the present invention will be listed and described first.

(1) A method of manufacturing a wide band gap semiconductor device according to this embodiment includes the steps of preparing a wide band gap semiconductor substrate having a pair of opposite main surfaces, with an electrode formed on each of the pair of main surfaces, separating the wide band gap semiconductor substrate into a plurality of first semiconductor chips, fixing the plurality of first semiconductor chips on a conductive fixation member, after the step of fixing the first semiconductor chips, measuring a breakdown voltage of each of the first semiconductor chips while immersing at least the first semiconductor chips in inert liquid, and after the step of measuring a breakdown voltage of each of the first semiconductor chips, providing a plurality of second semiconductor chips each having each of the first semiconductor chips fixed on the fixation member, by cutting the fixation member.

Diligent efforts were made by the present inventor to ascertain the reason that a defective semiconductor element (chip) is found during a module inspection even if no defect was detected during a breakdown voltage measurement in the state of a semiconductor substrate. As a result, it was found that a defective chip occurs due to problems with a dicing process or the like during separation into individual chips after the breakdown voltage measurement in the state of a semiconductor substrate, and that mounting of the defective chip on a module may reduce a manufacturing yield.

In the method of manufacturing a wide band gap semiconductor device described above, the breakdown voltage of the each of the separated first semiconductor chips is measured in the inert liquid, with the first semiconductor chips being fixed on the fixation member. Accordingly, the breakdown voltage measurement can be readily made in the inert liquid in the state of a chip, and a defect that may occur during the separation into chips can be detected in advance prior to mounting of the chips on the module. Then, only chips that have been confirmed to be non-defective ones can be mounted on the module, thereby improving a manufacturing yield of semiconductor modules. According to the method of manufacturing a wide band gap semiconductor device described above, therefore, a manufacturing yield of semiconductor modules can be improved.

As used herein, the "wide band gap semiconductor" refers to a semiconductor having a band gap wider than that of silicon (Si), and includes, for example, silicon carbide (SiC), gallium nitride (GaN) and diamond.

(2) In the method of manufacturing a wide band gap semiconductor device described above, the step of fixing the first semiconductor chips may include the steps of preparing the fixation member having a pair of opposite surfaces, with a first joining member and a second joining member disposed on the pair of surfaces, respectively, and fixing the first semiconductor chips on the fixation member with the first joining member interposed therebetween.

Thereby, the first semiconductor chips can be readily fixed on the fixation member using the first joining member, and the second semiconductor chips can be readily fixed on the separately prepared module substrate using the second joining member. In addition, by using the fixation member having the first joining member and the second joining member previously disposed thereon, manufacturing efficiency can be further improved.

(3) In the method of manufacturing a wide band gap semiconductor device described above, a material forming the first joining member may have a lower melting point than that of a material forming the second joining member.

Thereby, melting of the second joining member can be suppressed when the first joining member is melted to fix the first semiconductor chips.

(4) In the method of manufacturing a wide band gap semiconductor device described above, the step of fixing the first semiconductor chips may include the steps of preparing the fixation member having a first joining member disposed on one surface thereof, and fixing the first semiconductor chips on the fixation member with the first joining member interposed therebetween. The method of manufacturing a wide band gap semiconductor device described above may further include, after the step of measuring a breakdown voltage of each of the first semiconductor chips and before the step of providing second semiconductor chips, the step of disposing a second joining member on another surface opposite to the one surface.

Thereby, the first semiconductor chips can be readily fixed on the fixation member using the first joining member, and the second semiconductor chips can be readily fixed on the separately prepared module substrate using the second joining member. In addition, by disposing the second joining member after the step of measuring a breakdown voltage, the second semiconductor chips can be provided without immersing the second joining member in the inert liquid.

(5) In the method of manufacturing a wide band gap semiconductor device described above, a material forming the first joining member may have a higher melting point than that of a material forming the second joining member.

Thereby, the second joining member can be melted under lower temperature conditions when the second semiconductor chips are fixed on the module substrate using the second joining member.

(6) In the method of manufacturing a wide band gap semiconductor device described above, the first joining member and the second joining member may be made of a material selected from the group consisting of a material including silver and a gold-tin alloy.

Since the aforementioned materials have low electrical resistance, the use of the aforementioned materials can further improve the electrical characteristics of the semiconductor module having the second semiconductor chips mounted thereon. In addition, since the aforementioned materials have high thermal conductivity, the use of the aforementioned materials can further improve the heat dissipation characteristics of the semiconductor module having the second semiconductor chips mounted thereon.

(7) In the method of manufacturing a wide band gap semiconductor device described above, the fixation member may be made of a material selected from the group consisting of copper, aluminum, silver and a copper-tungsten alloy.

Since the aforementioned materials have low electrical resistance, the use of the aforementioned materials can further improve the electrical characteristics of the semiconductor module having the second semiconductor chips mounted thereon. In addition, since the aforementioned materials have high thermal conductivity, the use of the aforementioned materials can further improve the heat dissipation characteristics of the semiconductor module having the second semiconductor chips mounted thereon.

(8) A method of manufacturing a semiconductor module according to this embodiment includes the steps of preparing the second semiconductor chips using the method of manufacturing a wide band gap semiconductor device described above, preparing a module substrate, and mounting the second semiconductor chips on the module substrate.

In the method of manufacturing a semiconductor module described above, the second semiconductor chips are prepared using the method of manufacturing a wide band gap semiconductor device described above, so that mounting of a defective chip on the module can be suppressed. According to the method of manufacturing a semiconductor module described above, therefore, a manufacturing yield of semiconductor modules can be improved.

(9) A wide band gap semiconductor device according to this embodiment includes a first semiconductor chip having a pair of opposite main surfaces, with an electrode formed on each of the pair of main surfaces, a conductive fixation member, and a first joining member disposed on one surface of the fixation member to fix the first semiconductor chip on the fixation member. The fixation member has a width greater than that of the first semiconductor chip.

Being manufactured with the method of manufacturing a wide band gap semiconductor device described above, the wide band gap semiconductor device described above has the aforementioned configuration in which the fixation member has a width greater than that of the first semiconductor chip. According to the wide band gap semiconductor device described above, therefore, a wide band gap semiconductor device capable of improving a manufacturing yield of semiconductor modules can be provided.

(10) In the wide band gap semiconductor device described above, the first semiconductor chip may be made of silicon carbide or gallium nitride.

Silicon carbide and gallium nitride, which are typical wide band gap semiconductors, are suitable as a material forming the first semiconductor chip described above.

(11) In the wide band gap semiconductor device described above, a second joining member may be disposed on another surface opposite to the one surface of the fixation member.

Thereby, the wide band gap semiconductor device described above can be readily fixed on the separately prepared module substrate with the second joining member interposed therebetween.

(12) In the wide band gap semiconductor device described above, a material forming the first joining member may have a lower melting point than that of a material forming the second joining member.

Thereby, melting of the second joining member can be suppressed when the first joining member is melted to fix the first semiconductor chip on the fixation member.

(13) In the wide band gap semiconductor device described above, a material forming the first joining member may have a higher melting point than that of a material forming the second joining member.

Thereby, the second joining member can be melted under lower temperature conditions when the second joining member is melted to fix the wide band gap semiconductor device on the module substrate.

(14) In the wide band gap semiconductor device described above, the first joining member and the second joining member may be made of a material selected from the group consisting of a material including silver and a gold-tin alloy.

Thereby, the electrical characteristics and heat dissipation characteristics of the semiconductor module having the wide band gap semiconductor device mounted thereon can be further improved.

(15) In the wide band gap semiconductor device described above, the fixation member may be made of a material selected from the group consisting of copper, aluminum, silver and a copper-tungsten alloy.

Thereby, the electrical characteristics and heat dissipation characteristics of the semiconductor module having the wide band gap semiconductor device mounted thereon can be further improved.

(16) A semiconductor module according to this embodiment includes the wide band gap semiconductor device described above, and a module substrate on which the wide band gap semiconductor device described above is mounted.

The semiconductor module described above includes the wide band gap semiconductor device described above capable of improving a manufacturing yield of semiconductor modules. According to the semiconductor module described above, therefore, semiconductor modules with an improved manufacturing yield can be provided.

Details of Embodiments of the Present Invention

Specific examples of the embodiments of the present invention will now be described with reference to the drawings. In the following drawings, the same or corresponding parts are designated by the same reference numbers and description thereof will not be repeated.

First Embodiment

Structure of Semiconductor Module

A first embodiment, one of the embodiments of the present invention, is described first. Referring to FIG. 1, a semiconductor module 1 according to this embodiment mainly includes a plurality of silicon carbide semiconductor devices 10, a module substrate 2 on which silicon carbide semiconductor devices 10 are mounted, terminals 3, and wires 4. Silicon carbide semiconductor devices 10 are wide band gap semiconductor devices according to this embodiment to be described later.

Module substrate 2 includes an insulating substrate (not shown), a radiator plate as a heat sink made of metal (not shown), or the like. Silicon carbide semiconductor devices 10 are disposed on a surface 2A of module substrate 2, and connected to each other by wire 4. Terminals 3 are connected to silicon carbide semiconductor devices 10 by wires 4. It is noted that semiconductor module 1 may be sealed with resin (not shown) or the like.

(Structure of Silicon Carbide Semiconductor Device)

Figure 2:
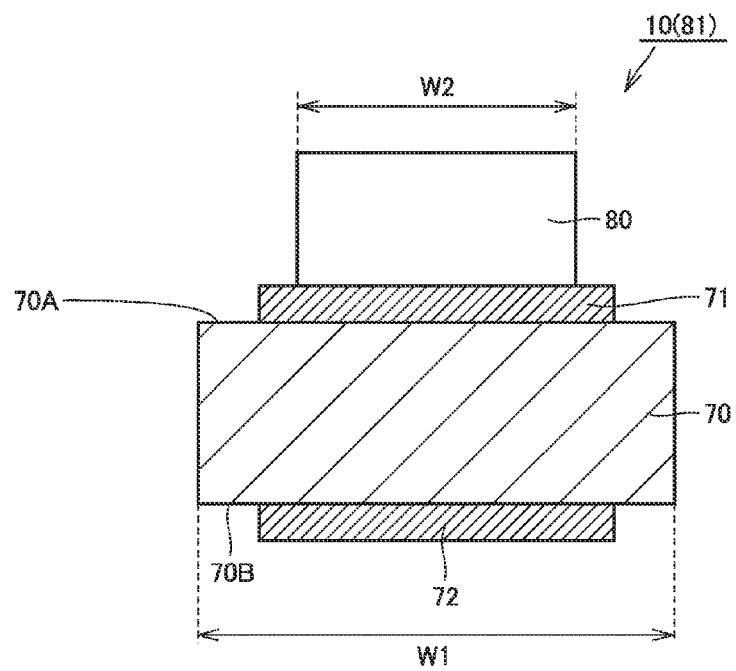
FIG. 2 is a schematic sectional view showing a structure of a wide band gap semiconductor device according to the first embodiment.

Next, a structure of silicon carbide semiconductor device 10 as the wide band gap semiconductor device according to this embodiment is described. Referring to FIG. 2, silicon carbide semiconductor device 10 mainly includes a first semiconductor chip 80, a fixation member 70, a first die bonding material 71 (first joining member), and a second die bonding material 72 (second joining member).

Fixation member 70 is made of a material selected from the group consisting of copper (Cu), aluminum (Al), silver (Ag) and copper-tungsten (CuW). Being made of a metallic material in this manner, fixation member 70 is conductive.

Fixation member 70 has a width greater than that of first semiconductor chip 80 as shown in FIG. 2 (W1>W2). A width W1 of fixation member 70 is 1 mm or more and 10 mm or less, and preferably 2 mm or more and 9 mm or less.

First die bonding material 71 is disposed on one surface 70A of fixation member 70. Second die bonding material 72 is disposed on another surface 70B opposite to surface 70A. First semiconductor chip 80 is disposed on first die bonding material 71 (side opposite to the fixation member 70 side). That is, first semiconductor chip 80 is fixed on fixation member 70 by first die bonding material 71.

First and second die bonding materials 71 and 72 are made of a material selected from the group consisting of a material including silver (Ag) such as silver paste and a gold-tin (AuSn) alloy. Thus, first and second die bonding materials 71 and 72 are conductive. In addition, first and second die bonding materials 71 and 72 are made of materials having different melting points. In this embodiment, a material forming first die bonding material 71 has a lower melting point than that of a material forming the second die bonding material.

(Structure of First Semiconductor Chip)

Figure 3:
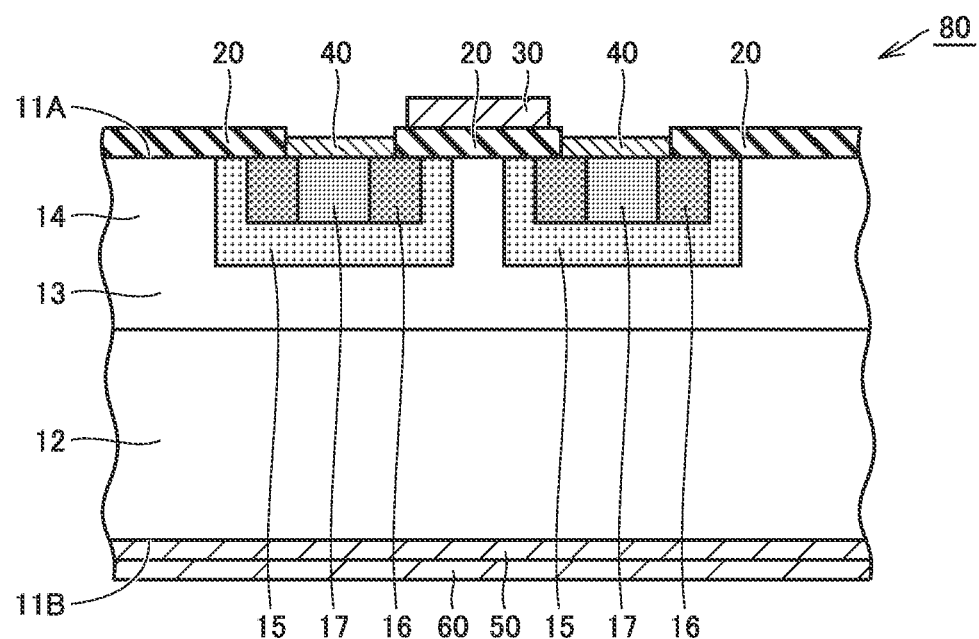
FIG. 3 is a schematic sectional view showing a structure of a first semiconductor chip in the wide band gap semiconductor device according to the first embodiment.

Next, a structure of first semiconductor chip 80 is described in detail. Referring to FIG. 3, first semiconductor chip 80 mainly includes a base substrate 12, an epitaxial growth layer 13, a gate oxide film 20, a gate electrode 30, a source electrode 40, a drain electrode 50, and a backside pad electrode 60. Epitaxial growth layer 13 mainly has a drift region 14, a body region 15, a source region 16, and a contact region 17. A plurality of the aforementioned structures are formed in first semiconductor chip 80. First semiconductor chip 80 may be in contact with first die bonding material 71 (see FIG. 2) at backside pad electrode 60 (electrode disposed on a main surface 11B), or may be in contact with first die bonding material 71 (see FIG. 2) at backside pad electrode 60 and base substrate 12 not covered with backside pad electrode 60.

Base substrate 12 and epitaxial growth layer 13 are made of silicon carbide, for example. Drift region 14 includes an n type impurity such as nitrogen (N), and is formed on one main surface of base substrate 12.

Body region 15 includes a p type impurity such as aluminum (Al) and boron (B), and is formed in epitaxial growth layer 13 so as to include a main surface 11A. Source region 16 includes an n type impurity such as phosphorus (P), and is formed in body region 15 so as to include main surface 11A. Contact region 17 includes a p type impurity as with body region 15, and is formed in body region 15 so as to be adjacent to source region 16.

Gate oxide film 20 is made of silicon dioxide ($SiO_2$), for example, and formed to cover main surface 11A. Gate electrode 30 is made of a conductor such as polysilicon doped with an impurity or aluminum, and formed on gate oxide film 20.

Source electrode 40 is formed so as to be in contact with source region 16 and contact region 17 on main surface 11A. Source electrode 40 is made of a material capable of making ohmic contact with source region 16, for example, $Ni_xSi_y$ (nickel silicide), $Ti_xSi_y$ (titanium silicide), $Al_xSi_y$ (aluminum silicide) and $Ti_xAl_ySi_z$ (titanium aluminum silicide), and electrically connected to source region 16 (x>0, y>0, z>0).

Drain electrode 50 is formed on the other main surface 11B opposite to main surface 11A. Drain electrode 50 is made of, for example, a material similar to that for source electrode 40. Backside pad electrode 60 is made of gold (Au) or aluminum (Al), for example, and formed on drain electrode 50. Backside pad electrode 60 has a thickness of 1 μm, for example.

(Operation of Silicon Carbide Semiconductor Device and Semiconductor Module)

Next, operation of silicon carbide semiconductor device 10 according to this embodiment is described. Referring to FIG. 3, first, when a voltage applied to gate electrode 30 is lower than a threshold voltage, namely, in an OFF state, even if a voltage is applied between source electrode 40 and drain electrode 50, a pn junction formed between body region 15 and drift region 14 is reverse biased, resulting in a non-conducting state. When a voltage equal to or higher than the threshold voltage is applied to gate electrode 30, on the other hand, an inversion layer is formed in a channel region of body region 15 (body region 15 below gate electrode 30). As a result, source region 16 and drift region 14 are electrically connected together, causing a current to flow between source electrode 40 and drain electrode 50. This causes operation of silicon carbide semiconductor device 10. In addition, semiconductor module 1 operates by a combination of the aforementioned operations of individual silicon carbide semiconductor devices 10.

Silicon carbide semiconductor device 10 according to this embodiment has a configuration as described above, and is manufactured with a method of manufacturing a wide band gap semiconductor device according to this embodiment to be described later. Thus, silicon carbide semiconductor device 10 described above can improve a manufacturing yield of semiconductor modules. In addition, semiconductor module 1 according to this embodiment includes silicon carbide semiconductor devices 10 described above, and thus has an improved manufacturing yield.

In the wide band gap semiconductor device according to this embodiment described above, first semiconductor chip 80 may be made of silicon carbide, but this is not limiting. First semiconductor chip 80 may be made of other wide band gap semiconductors such as gallium nitride or diamond.

In silicon carbide semiconductor device 10 described above, second die bonding material 72 may be disposed on the other surface 70B opposite to one surface 70A of fixation member 70, as shown in FIG. 2. Thereby, silicon carbide semiconductor device 10 can be readily fixed on module substrate 2 with the second die bonding material interposed therebetween, as shown in FIG. 1.

In silicon carbide semiconductor device 10 described above, the material forming first die bonding material 71 may have a lower melting point than that of the material forming second die bonding material 72, as described above. Thereby, melting of second die bonding material 72 can be suppressed when first die bonding material 71 is melted to fix first semiconductor chip 80 on fixation member 70.

In silicon carbide semiconductor device 10 described above, first and second die bonding materials 71 and 72 may be made of a material selected from the group consisting of a material including silver and a gold-tin alloy, as described above. Fixation member 70 may be made of a material selected from the group consisting of copper, aluminum, silver and copper-tungsten. Since the aforementioned materials have low electrical resistance and high thermal conductivity, the use of the aforementioned materials can further improve the electrical characteristics and heat dissipation characteristics of semiconductor module 1 having the aforementioned silicon carbide semiconductor devices 10 mounted thereon (see FIG. 1).

(Method of Manufacturing Silicon Carbide Semiconductor Device)

Next, methods of manufacturing the semiconductor module and the wide band gap semiconductor device (silicon carbide semiconductor device) according to this embodiment are described. In the method of manufacturing the wide band gap semiconductor device according to this embodiment, silicon carbide semiconductor device 10 according to this embodiment described above is manufactured by performing steps (S10) to (S50) (see FIG. 4). Further, in the method of manufacturing the semiconductor module according to this embodiment, semiconductor module 1 according to this embodiment described above is manufactured by performing steps (S60) to (S80) (see FIG. 5).

Figure 4:
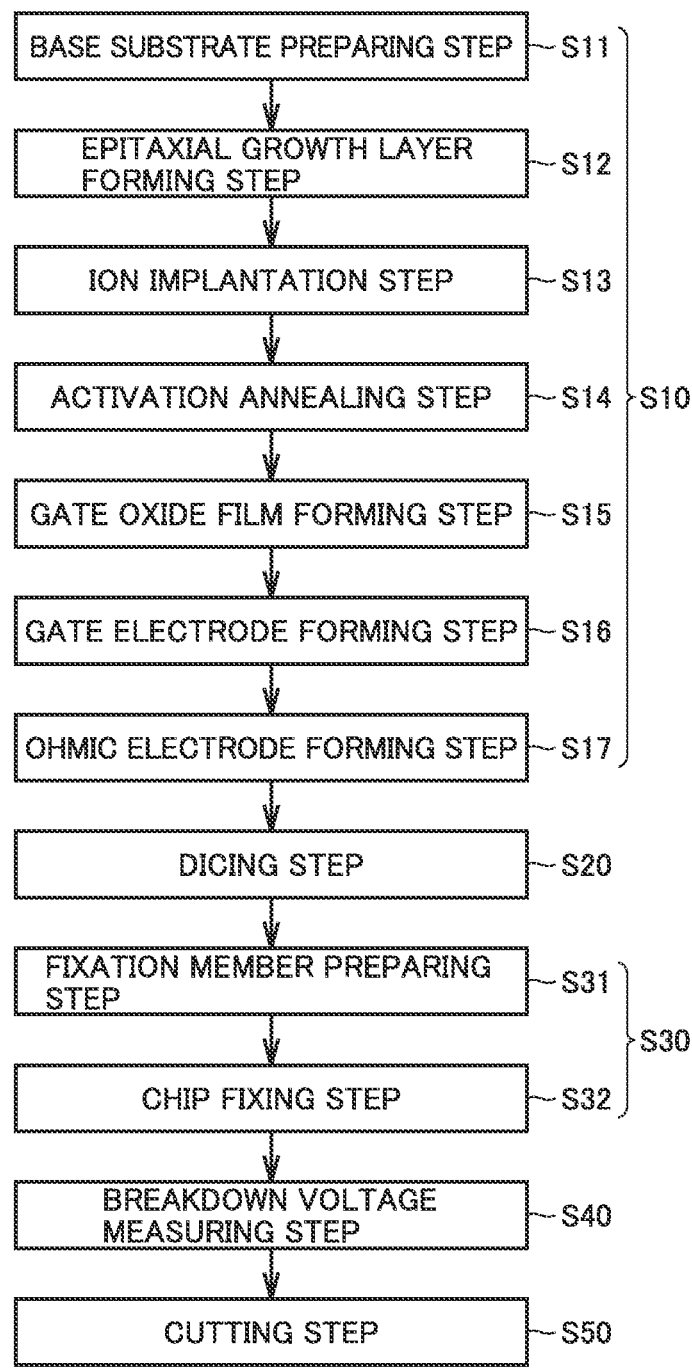
FIG. 4 is a flowchart schematically showing a method of manufacturing the wide band gap semiconductor device according to the first embodiment.

Referring to FIG. 4, in the method of manufacturing the wide band gap semiconductor device according to this embodiment, first, a semiconductor substrate preparing step is performed as a step (S10). In this step (S10), a silicon carbide substrate 11 (wide band gap semiconductor substrate) is prepared by performing steps (S11) to (S17) described below.

Figure 6:
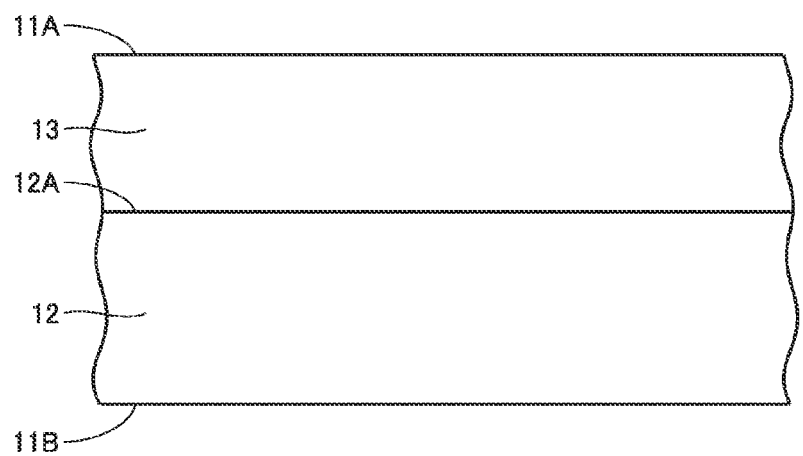
FIG. 6 is a schematic diagram illustrating steps (S11) and (S12) in the method of manufacturing the wide band gap semiconductor device according to the first embodiment.

First, a base substrate preparing step is performed as a step (S11). In this step (S11), referring to FIG. 6, base substrate 12 made of 4H—SiC and having n type conductivity is prepared.

Next, an epitaxial growth layer forming step is performed as a step (S12). In this step (S12), referring to FIG. 6, epitaxial growth layer 13 having n type conductivity is formed on a surface 12A of base substrate 12.

Figure 7:
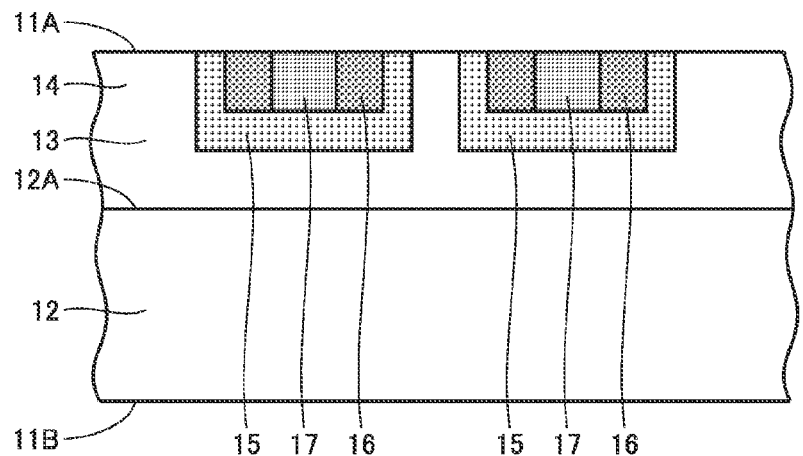
FIG. 7 is a schematic diagram illustrating steps (S13) and (S14) in the method of manufacturing the wide band gap semiconductor device according to the first embodiment.

Next, an ion implantation step is performed as a step (S13). In this step (S13), referring to FIG. 7, first, aluminum (Al) ions, for example, are implanted into epitaxial growth layer 13 to form body region 15. Then, phosphorus (P) ions, for example, are implanted into epitaxial growth layer 13 to form source region 16. Then, aluminum (Al) ions, for example, are implanted into epitaxial growth layer 13 to form contact region 17. Then, a region in epitaxial growth layer 13 where none of body region 15, source region 16 and contact region 17 is formed serves as drift region 14.

Next, an activation annealing step is performed as a step (S14). In this step (S14), referring to FIG. 7, base substrate 12 is heated to activate the introduced impurities, with the result that desired carriers are generated in the regions into which the impurities were introduced.

Figure 8:
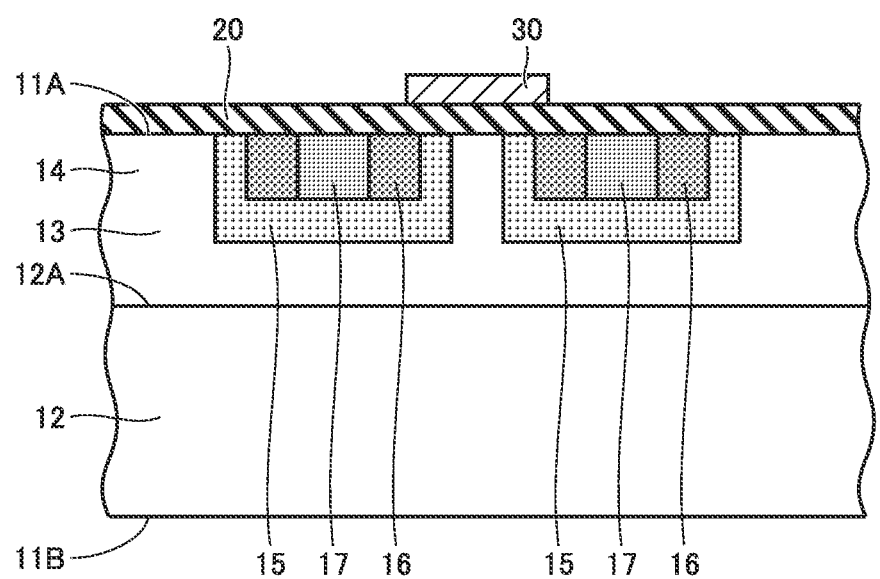
FIG. 8 is a schematic diagram illustrating steps (S15) and (S16) in the method of manufacturing the wide band gap semiconductor device according to the first embodiment.

Next, a gate oxide film forming step is performed as a step (S15). In this step (S15), referring to FIG. 8, base substrate 12 is heated in an atmosphere including oxygen ($O_2$), for example, to form gate oxide film 20 made of silicon dioxide ($SiO_2$).

Next, a gate electrode forming step is performed as a step (S16). In this step (S16), referring to FIG. 8, gate electrode 30 being in contact with an upper surface of gate oxide film 20 and made of polysilicon is formed by LPCVD (Low Pressure Chemical Vapor Deposition), for example.

Figure 9:
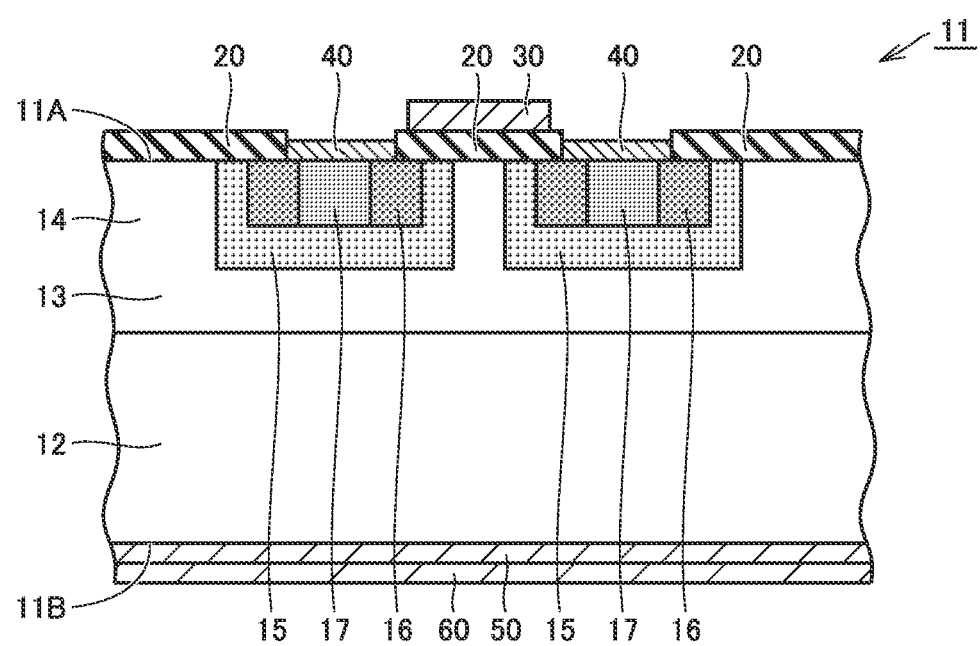
FIG. 9 is a schematic diagram illustrating a step (S17) in the method of manufacturing the wide band gap semiconductor device according to the first embodiment.
Figure 10:
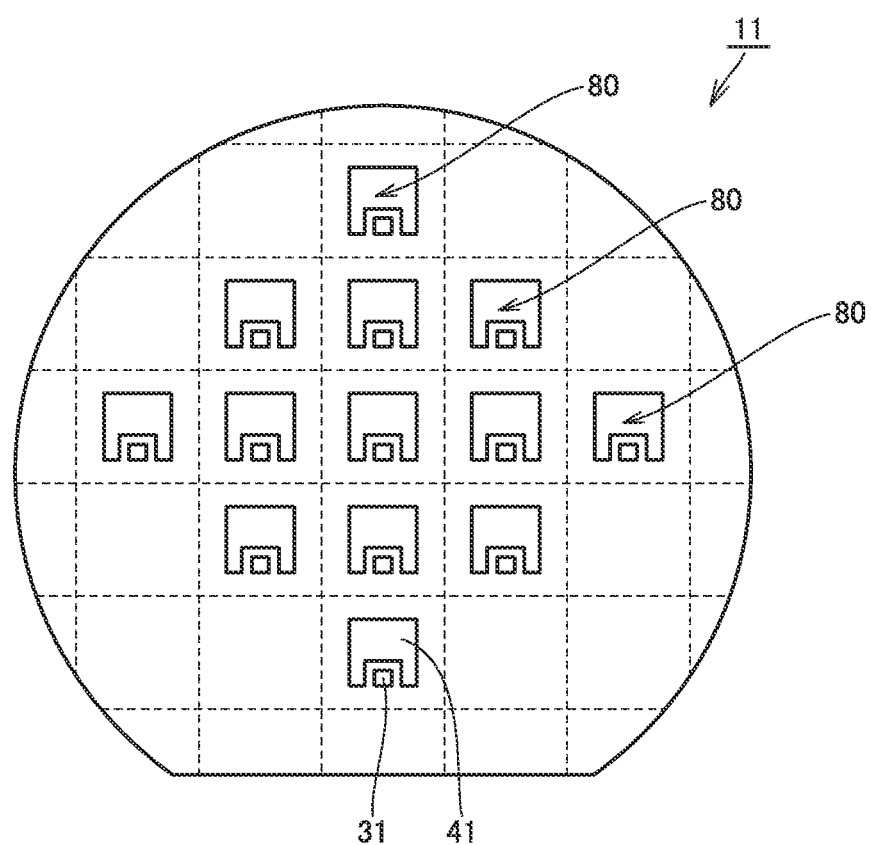
FIG. 10 is a schematic diagram illustrating a step (S20) in the method of manufacturing the wide band gap semiconductor device according to the first embodiment.

Next, an ohmic electrode forming step is performed as a step (S17). In this step (S17), referring to FIG. 9, part of gate oxide film 20 (over source region 16 and contact region 17) is removed by etching, and then source electrode 40 is formed on main surface 11A. In addition, drain electrode 50 is formed on the other main surface 11B opposite to main surface 11A. In addition, backside pad electrode 60 is further formed on drain electrode 50. Furthermore, a gate pad electrode electrically connected to an interlayer insulating film (not shown) and gate electrode 30, a source wire electrically connected to source electrode 40, and the like are subsequently formed. By performing the steps (S11) to (S17) described above, silicon carbide substrate 11 (wide band gap semiconductor substrate) is prepared, with source electrode 40 and drain electrode 50 formed on the pair of opposite main surfaces 11A and 11B, respectively. As shown in FIG. 10, silicon carbide substrate 11 includes a plurality of regions which will be first semiconductor chips 80 after cutting.

Next, a dicing step is performed as a step (S20). In this step (S20), referring to FIG. 10, silicon carbide substrate 11 including a plurality of gate pad electrodes 31 and source wires 41 and provided with the plurality of regions which will be first semiconductor chips 80 is subjected to a dicing process as indicated with broken lines in the figure. Thereby, silicon carbide substrate 11 is separated into the plurality of first semiconductor chips 80.

Next, a semiconductor chip fixing step is performed as a step (S30). In this step (S30), the plurality of first semiconductor chips 80 are fixed on fixation member 70 by performing steps (S31) and (S32) described below.

First, a fixation member preparing step is performed as a step (S31). In this step (S31), referring to FIG. 11, fixation member 70 having the pair of opposite surfaces 70A and 70B, with first die bonding material 71 and second die bonding material 72 disposed on surfaces 70A and 70B, respectively, is prepared. First and second die bonding materials 71 and 72 may disposed at a plurality of locations of surfaces 70A and 70B, respectively, or may be disposed on the entire surfaces 70A and 70B.

Fixation member 70 is made of a material selected from the group consisting of copper (Cu), aluminum (Al), silver (Ag) and copper-tungsten (CuW). Fixation member 70 is thus conductive. First and second die bonding materials 71 and 72 are made of a material selected from the group consisting of a material including silver (Ag) such as silver paste and a gold-tin alloy (AuSn). Further, in this embodiment, the material forming first die bonding material 71 has a lower melting point than that of the material forming second die bonding material 72.

Figure 11:
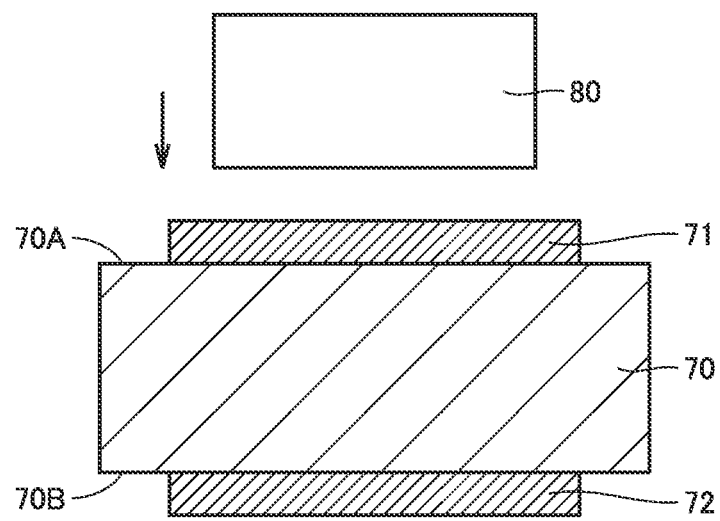
FIG. 11 is a schematic diagram illustrating a step (S30) in the method of manufacturing the wide band gap semiconductor device according to the first embodiment.
Figure 12:
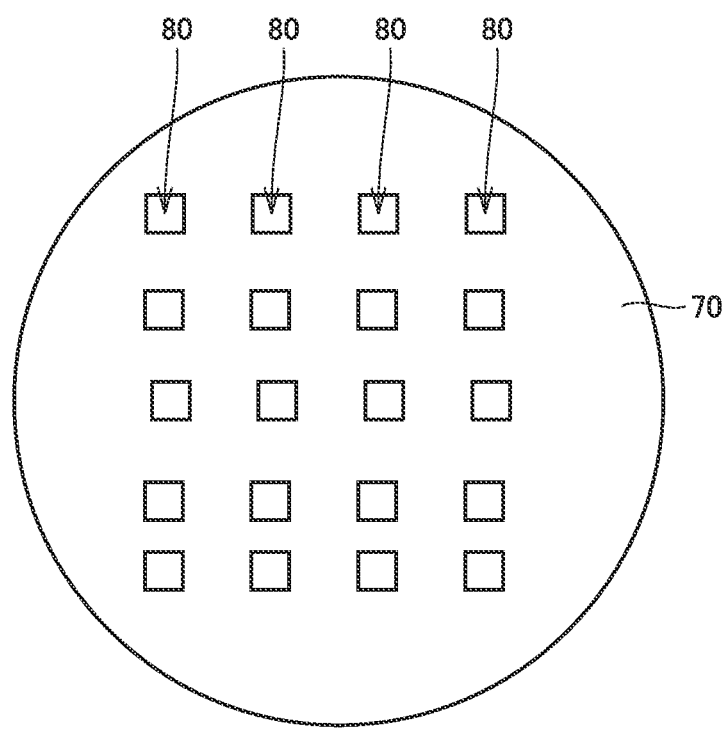
FIG. 12 is a schematic plan view illustrating the step (S30) in the method of manufacturing the wide band gap semiconductor device according to the first embodiment.

Next, a chip fixing step is performed as a step (S32). In this step (S32), referring to FIG. 11, first, fixation member 70 is heated at a temperature equal to or higher than the melting point of first die bonding material 71 to thereby melt first die bonding material 71. Then, first semiconductor chip 80 is disposed on now melted first die bonding material 71 (first semiconductor chip 80 makes contact with first die bonding material 71 from a direction indicated with an arrow in FIG. 11). Then, fixation member 70 and first semiconductor chip 80 are cooled. Thereby, the plurality of first semiconductor chips 80 are fixed on fixation member 70 with first die bonding material 71 interposed therebetween, as shown in FIGS. 11 and 12.

Figure 13:
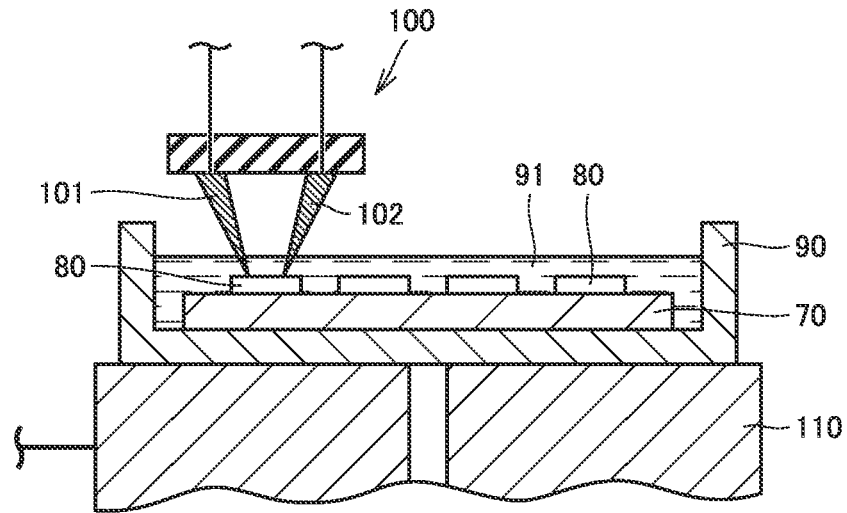
FIG. 13 is a schematic diagram illustrating a step (S40) in the method of manufacturing the wide band gap semiconductor device according to the first embodiment.

Next, a breakdown voltage measuring step is performed as a step (S40). In this step (S40), referring to FIG. 13, a tray 90 containing inert liquid 91 such as Fluorinert is prepared first. Then, fixation member 70 having first semiconductor chips 80 fixed thereon is disposed in tray 90. Thereby, the whole of first semiconductor chips 80 and fixation member 70 is immersed in Fluorinert as shown in FIG. 13. Then, needles 101 and 102 of a probe 100 are brought into contact with the gate pad electrode and the source wire of each of first semiconductor chips 80 as shown in FIG. 13, and a voltage is supplied between probe 100 and a stage 110. A breakdown voltage of each of first semiconductor chips 80 is thus measured. After completion of the breakdown voltage measurement described above, fixation member 70 is removed from tray 90.

Figure 14:
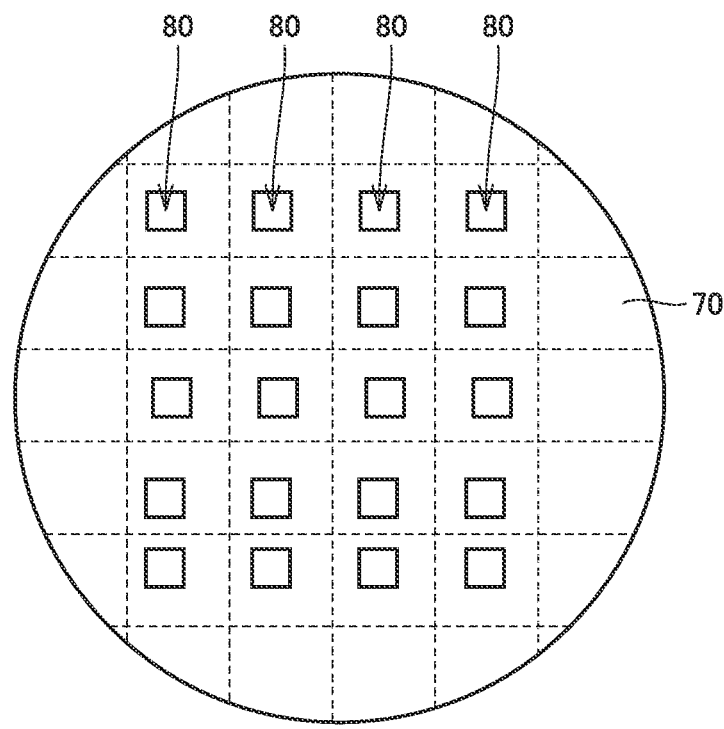
FIG. 14 is a schematic diagram illustrating a step (S50) in the method of manufacturing the wide band gap semiconductor device according to the first embodiment.

Next, a cutting step is performed as a step (S50). In this step (S50), referring to FIG. 14, fixation member 70 is subjected to a dicing process as indicated with broken lines in the figure, to cut fixation member 70. Thereby, a plurality of second semiconductor chips 81 (silicon carbide semiconductor devices 10) each having each of first semiconductor chips 80 fixed on fixation member 70 is provided (see FIG. 2).

Figure 15:
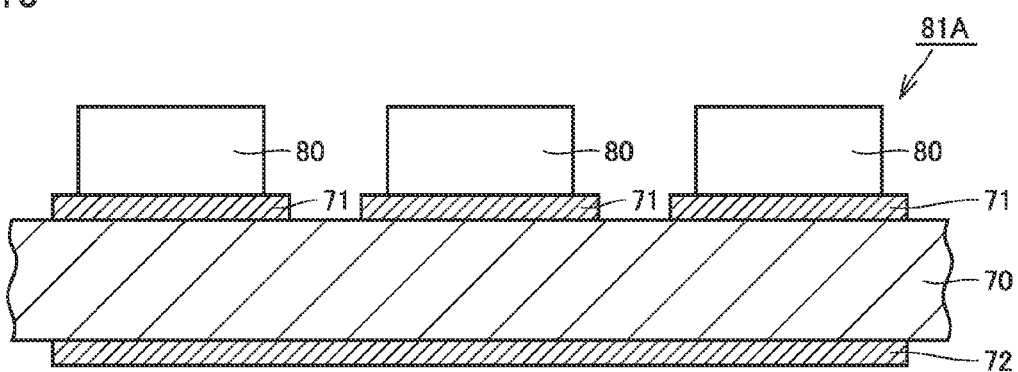
FIG. 15 is a schematic sectional view showing a structure of a wide band gap semiconductor device according to a variation of the first embodiment.

In this step (S50), second semiconductor chips 81 each having one first semiconductor chip 80 fixed on one fixation member 70 may be provided as shown in FIG. 2, but this is not limiting. As shown in FIG. 15, fixation member 70 may be cut so as to provide second semiconductor chips 81A each having a plurality of first semiconductor chips 80 fixed side by side on one fixation member 70.

(Method of Manufacturing Semiconductor Module)

Figure 5:
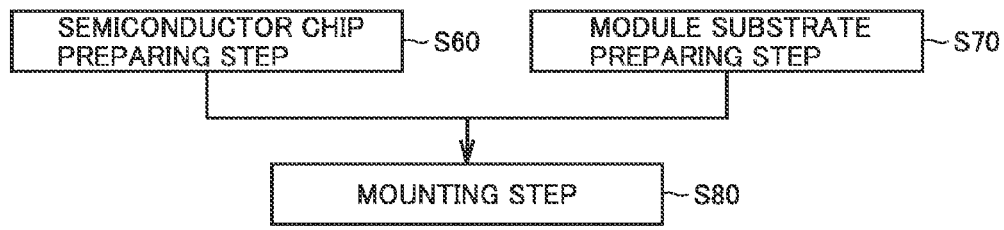
FIG. 5 is a flowchart schematically showing a method of manufacturing the semiconductor module according to the first embodiment.

Next, the method of manufacturing the semiconductor module according to this embodiment is described. Referring to FIG. 5, in the method of manufacturing the semiconductor module according to this embodiment, first, a semiconductor chip preparing step is performed as a step (S60). In this step (S60), referring to FIG. 2, second semiconductor chips 81 are prepared with the method of manufacturing the wide band gap semiconductor device according to this embodiment described above. In addition, module substrate 2 is separately prepared (see FIG. 1) by performing a step (S70) in parallel with this step (S60).

After completion of the steps (S60) and (S70), a mounting step is performed as a step (S80). In this step (S80), referring to FIG. 1, the plurality of second semiconductor chips 81 (silicon carbide semiconductor devices 10) are disposed on surface 2A of module substrate 2. Then, second semiconductor chips 81 are connected together, and second semiconductor chips 81 are connected to terminals 3, by wires 4.

In this manner, semiconductor module 1 having second semiconductor chips 81 mounted on module substrate 2 is provided.

As described above, in the methods of manufacturing the wide band gap semiconductor device and the semiconductor module according to this embodiment, the breakdown voltage of each of separated first semiconductor chips 80 is measured in inert liquid 91, with first semiconductor chips 80 being fixed on fixation member 70. Accordingly, the breakdown voltage measurement can be readily made in inert liquid 91 in the state of a chip, and a chip defect that may occur by the dicing process in the step (S20) can be detected in advance prior to mounting to the module in the step (S80). Then, only chips that have been confirmed to be non-defective ones can be mounted on the module in the step (S80), thereby improving a manufacturing yield of semiconductor modules. Therefore, the methods of manufacturing the wide band gap semiconductor and the semiconductor module according to this embodiment can improve a manufacturing yield of semiconductor modules.

In the method of manufacturing the wide band gap semiconductor device described above, the semiconductor chip fixing step (S30) may include the step (S31) of preparing fixation member 70 having the pair of opposite surfaces 70A and 70B as described above, with first and second die bonding materials 71 and 72 disposed on the pair of surfaces 70A and 70B, respectively, and the step (S32) of fixing first semiconductor chips 80 on fixation member 70 with first die bonding material 71 interposed therebetween. In this case, the material forming first die bonding material 71 may have a lower melting point than that of the material forming second die bonding material 72.

Thereby, first semiconductor chips 80 can be readily fixed on fixation member 70 using first die bonding material 71, and second semiconductor chips 81 can be readily fixed on separately prepared module substrate 2 using second die bonding material 72. In addition, by using fixation member 70 having first and second die bonding materials 71 and 72 previously disposed thereon, manufacturing efficiency can be further improved. Further, by making first die bonding material 71 of the material having a lower melting point than that of the material for second die bonding material 72, melting of second die bonding material 72 can be suppressed when first die bonding material 71 is melted to fix first semiconductor chips 80.

In the method of manufacturing the wide band gap semiconductor device described above, first and second die bonding materials 71 and 72 may be made of a material selected from the group consisting of a material including silver (Ag) and a gold-tin (Au—Sn) alloy. Fixation member 70 may be made of a material selected from the group consisting of copper (Cu), aluminum (Al), silver (Ag) and copper-tungsten (CuW). Since the aforementioned materials have low electrical resistance and high thermal conductivity, the use of the aforementioned materials can further improve the electrical characteristics and heat dissipation characteristics of semiconductor module 1 having second semiconductor chips 81 mounted thereon.

Second Embodiment

Next, a second embodiment, another embodiment of the present invention, is described. A wide band gap semiconductor device and a semiconductor module according to the second embodiment basically have similar configurations, operate similarly, and provide similar effects to the wide band gap semiconductor device and the semiconductor module according to the first embodiment described above. In addition, methods of manufacturing the wide band gap semiconductor device and the semiconductor module according to the second embodiment are basically performed similarly and provide similar effects to the methods of manufacturing the wide band gap semiconductor device and the semiconductor module according to the first embodiment described above. However, the wide band gap semiconductor device according to the second embodiment is different from the first embodiment described above in the melting points of the die bonding materials. In addition, the method of manufacturing the wide band gap semiconductor device according to the second embodiment is different from the first embodiment described above in the order of disposing the die bonding materials on the fixation member.

(Structure of Silicon Carbide Semiconductor Device)

Figure 16:
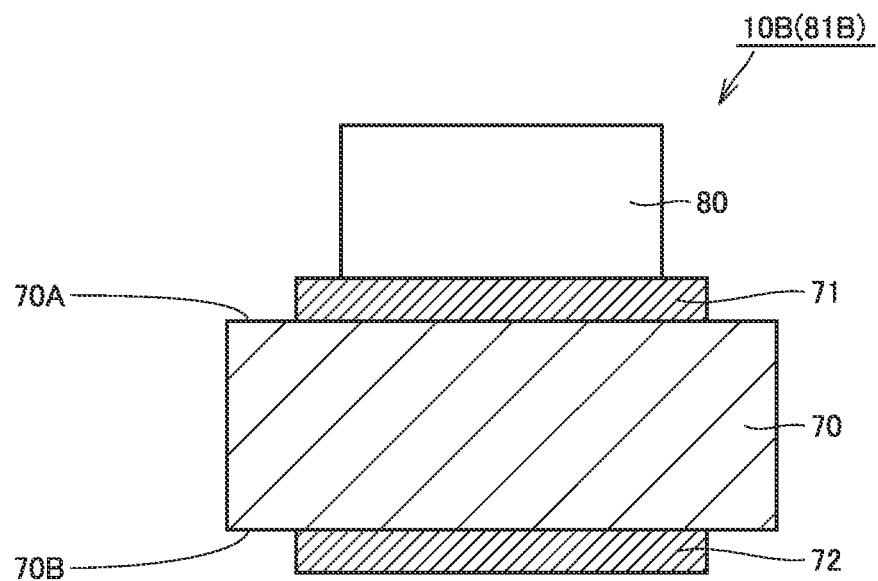
FIG. 16 is a schematic sectional view showing a structure of a wide band gap semiconductor device according to a second embodiment.

Referring to FIG. 16, a silicon carbide semiconductor device 10B as a wide band gap semiconductor device according to this embodiment mainly includes, as in the first embodiment described above, first semiconductor chips 80, fixation member 70 having surfaces 70A and 70B, and first and second die bonding materials 71 and 72. In this embodiment, the material forming first die bonding material 71 has a higher melting point than that of the material forming second die bonding material 72.

(Method of Manufacturing Silicon Carbide Semiconductor Device)

Figure 17:
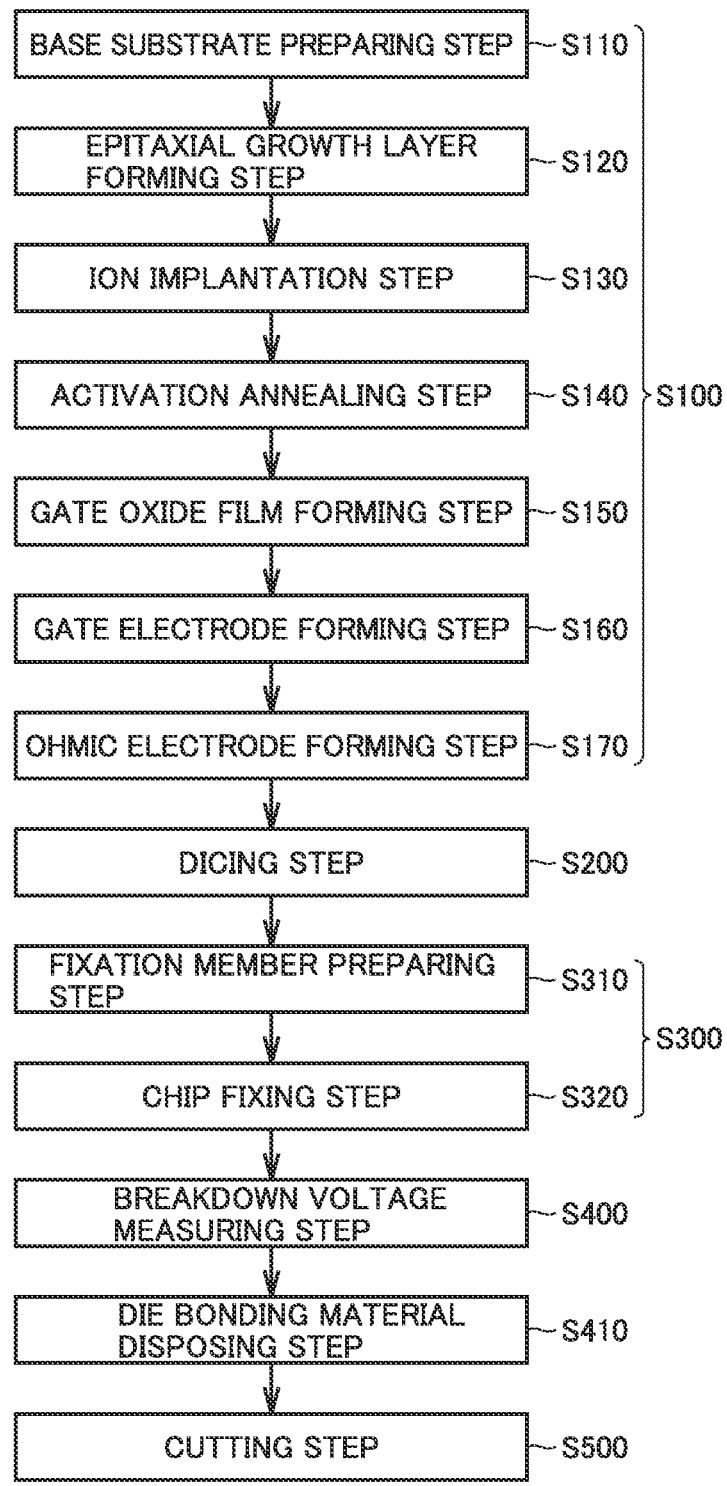
FIG. 17 is a flowchart schematically showing a method of manufacturing the wide band gap semiconductor device according to the second embodiment.
Figure 18:
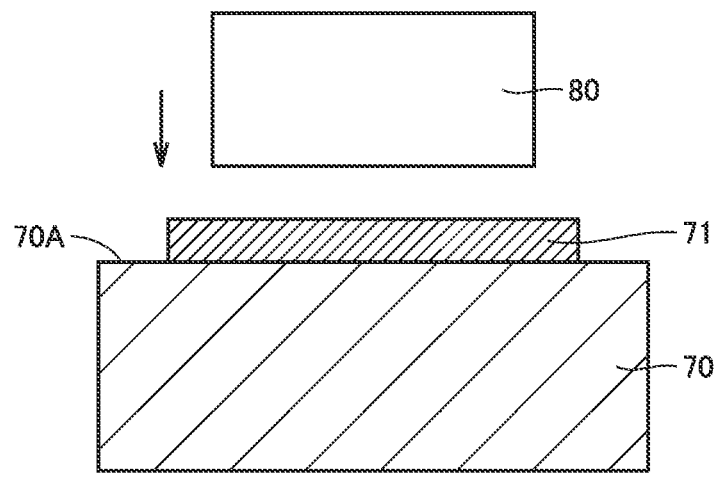
FIG. 18 is a schematic diagram illustrating a step (S300) in the method of manufacturing the wide band gap semiconductor device according to the second embodiment.

Next, the method of manufacturing the wide band gap semiconductor device (silicon carbide semiconductor device) according to this embodiment is described. Referring to FIG. 17, first, steps (S100) and (S200) are performed by the same procedure as the steps (S10) and (S20) of the first embodiment described above. Thereby, the plurality of first semiconductor chips 80 are provided (see FIG. 18).

Next, a semiconductor chip fixing step is performed as a step (S300). In this step (S300), first semiconductor chips 80 are fixed on fixation member 70 by performing steps (S310) and (S320) described below.

First, a fixation member preparing step is performed as a step (S310). In this step (S310), referring to FIG. 18, fixation member 70 having first die bonding material 71 disposed on one main surface 70A is prepared. Then, a chip fixing step is performed as a step (S320). In this step (S320), referring to FIG. 18, first semiconductor chips 80 are fixed on fixation member 70 with first die bonding material 71 interposed therebetween, by the same procedure as the step (S32) of the first embodiment described above.

Next, a breakdown voltage measuring step is performed as a step (S400). In this step (S400), the breakdown voltage of each of first semiconductor chips 80 is measured by the same procedure as the step (S40) of the first embodiment described above.

Figure 19:
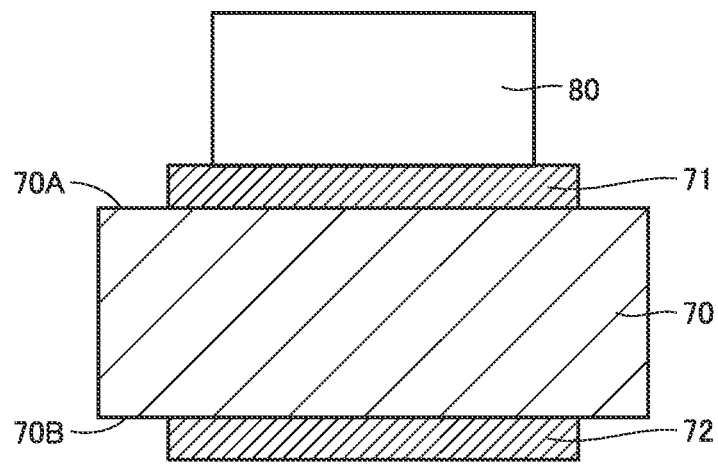
FIG. 19 is a schematic diagram illustrating a step (S410) in the method of manufacturing the wide band gap semiconductor device according to the second embodiment.

Next, a die bonding material disposing step is performed as a step (S410). In this step (S410), referring to FIG. 19, second die bonding material 72 is disposed on the other surface 70B opposite to surface 70A on which first die bonding material 71 has been disposed. Second die bonding material 72 may be formed with any film formation method. In this embodiment, the material forming first die bonding material 71 has a higher melting point than that of the material forming second die bonding material 72 (second die bonding material 72 has a lower melting point than that of first die bonding material 71).

Next, a cutting step is performed as a step (S500). In this step (S500), fixation member 70 is cut by the same procedure as the step (S50) of the first embodiment described above, to provide second semiconductor chips 81B (silicon carbide semiconductor devices 10B) (see FIG. 16).

As described above, in silicon carbide semiconductor device 10B according to this embodiment, the material forming first die bonding material 71 has a higher melting point than that of the material forming second die bonding material 72. That is, second die bonding material 72 is made of a material having a low melting point as compared to that of first die bonding material 71. Thus, second die bonding material 72 can be melted under lower temperature conditions when second die bonding material 72 is melted to fix silicon carbide semiconductor devices 10B on the module substrate.

Further, in the method of manufacturing the wide band gap semiconductor device according to this embodiment, the semiconductor chip fixing step (S300) includes the step (S310) of preparing fixation member 70 having first die bonding material 71 disposed on one surface 70A, and the step (S320) of fixing first semiconductor chips 80 on fixation member 70 with first die bonding material 71 interposed therebetween. In addition, the method of manufacturing the wide band gap semiconductor device described above further includes, after the breakdown voltage measuring step (S400) and before the cutting step (S500), the step of disposing second die bonding material 72 on the other surface 70B opposite to one surface 70A described above. In addition, the material forming first die bonding material 71 has a higher melting point than that of the material forming second die bonding material 72.

Thereby, first semiconductor chips 80 can be readily fixed on fixation member 70 using first die bonding material 71, as in the first embodiment, and second semiconductor chips 81B can be readily fixed on the separately prepared module substrate using second die bonding material 72. In addition, by disposing second die bonding material 72 after the breakdown voltage measuring step (S400), second semiconductor chips 81B can be provided without immersing second die bonding material 72 in inert liquid 91. Further, by making second die bonding material 72 of the material having a lower melting point than that of the material for first die bonding material 71, second die bonding material 72 can be melted under lower temperature conditions when second semiconductor chips 81B are fixed on the module substrate.

It should be understood that the embodiments disclosed herein are illustrative and non-restrictive in every respect. The scope of the present invention is defined by the terms of the claims, rather than the description above, and is intended to include any modifications within the scope and meaning equivalent to the terms of the claims.

INDUSTRIAL APPLICABILITY

The methods of manufacturing the wide band gap semiconductor device and the semiconductor module, and the wide band gap semiconductor device and the semiconductor module of the present invention can be applied particularly advantageously to methods of manufacturing a wide band gap semiconductor device and a semiconductor module, and a wide band gap semiconductor device and a semiconductor module, which are required to improve a manufacturing yield of semiconductor modules.

REFERENCE SIGNS LIST 1 semiconductor module; 10, 10B silicon carbide semiconductor device; 2 module substrate; 2A, 12A, 70A, 70B surface; 3 terminal; 4 wire; 11 silicon carbide substrate; 11A, 11B main surface; 12 base substrate; 13 epitaxial growth layer; 14 drift region; 15 body region; 16 source region; 17 contact region; 20 gate oxide film; 30 gate electrode; 31 gate pad electrode; 40 source electrode; 41 source wire; 50 drain electrode; 60 backside pad electrode; 70 fixation member; 71 first die bonding material; 72 second die bonding material; 80 first semiconductor chip; 81, 81A, 81B second semiconductor chip; 90 tray; 91 inert liquid; 100 probe; 101, 102 needle; 110 stage; W1, W2 width.

The invention claimed is:

1. A method of manufacturing a wide band gap semiconductor device, comprising the steps of:
   preparing a wide band gap semiconductor substrate having a pair of opposite main surfaces, with an electrode formed on each of the pair of main surfaces;
   separating the wide band gap semiconductor substrate into a plurality of first semiconductor chips;
   fixing the plurality of first semiconductor chips on a conductive fixation member, wherein the conductive fixation member is metallic;
   after the step of fixing the plurality of first semiconductor chips, discretely measuring a breakdown voltage of each of the plurality of first semiconductor chips while immersing at least the plurality of first semiconductor chips in inert liquid; and
   after the step of measuring a breakdown voltage of each of the plurality of first semiconductor chips, providing a plurality of second semiconductor chips each having each of the plurality of first semiconductor chips fixed on the conductive fixation member, by cutting the conductive fixation member.

2. The method of manufacturing a wide band gap semiconductor device according to claim 1, wherein
   the conductive fixation member has a pair of opposite surfaces, and
   the step of fixing the plurality of first semiconductor chips includes the steps of:
   preparing the conductive fixation member having the pair of opposite surfaces, with a first joining member and a second joining member disposed on the pair of surfaces, respectively, and
   fixing the plurality of first semiconductor chips on the conductive fixation member with the first joining member interposed therebetween.

3. The method of manufacturing a wide band gap semiconductor device according to claim 2, wherein
   a material forming the first joining member has a lower melting point than that of a material forming the second joining member.

4. The method of manufacturing a wide band gap semiconductor device according to claim 1, wherein
   the step of fixing the plurality of first semiconductor chips includes the steps of
   preparing the conductive fixation member having a first joining member disposed on one surface thereof, and
   fixing the plurality of first semiconductor chips on the conductive fixation member with the first joining member interposed there between, and
   the method further comprises, after the step of measuring a breakdown voltage of each of the plurality of first semiconductor chips and before the step of providing the plurality of second semiconductor chips, the step of disposing a second joining member on another surface opposite to the one surface.

5. The method of manufacturing a wide band gap semiconductor device according to claim 4, wherein
   a material forming the first joining member has a higher melting point than that of a material forming the second joining member.

6. The method of manufacturing a wide band gap semiconductor device according to claim 2, wherein
   the first joining member and the second joining member are made of a material selected from the group consisting of a material including silver and a material of gold-tin alloy.

7. The method of manufacturing a wide band gap semiconductor device according to claim 1, wherein
   the conductive fixation member is made of a material selected from the group consisting of copper, aluminum, silver and a copper-tungsten alloy.

8. A method of manufacturing a semiconductor module, comprising the steps of:
   preparing the plurality of second semiconductor chips using the method of manufacturing a wide band gap semiconductor device according to claim 1;
   preparing a module substrate; and
   mounting the plurality of second semiconductor chips on the module substrate.

* * * * *